(12) United States Patent
Knill

(10) Patent No.: US 9,217,777 B2
(45) Date of Patent: Dec. 22, 2015

(54) CURRENT SENSE CIRCUIT FOR MEASURING A CHARGE LEVEL OF A BATTERY

(71) Applicant: Sony Corporation, Minato-ku (JP)

(72) Inventor: Alexander Knill, Trondheim (NO)

(73) Assignee: Sony Corporation, Tokyo (JP)

( * ) Notice: Subject to any disclaimer, the term of this patent is extended or adjusted under 35 U.S.C. 154(b) by 175 days.

(21) Appl. No.: 14/055,057

(22) Filed: Oct. 16, 2013

(65) Prior Publication Data

US 2014/0159734 A1   Jun. 12, 2014

(30) Foreign Application Priority Data

Dec. 12, 2012 (GB) .................................. 1222326.9

(51) Int. Cl.
  *G01N 27/416* (2006.01)
  *G01R 31/36* (2006.01)
  *G01R 19/00* (2006.01)
  *G01R 1/20* (2006.01)

(52) U.S. Cl.
  CPC ........ *G01R 31/3606* (2013.01); *G01R 19/0092* (2013.01); *G01R 1/203* (2013.01)

(58) Field of Classification Search
  CPC ........... G01R 31/3648; G01R 31/3627; G01R 31/3662; G01R 31/3631; Y02E 60/12
  USPC ....................................................... 324/426
  See application file for complete search history.

(56) References Cited

U.S. PATENT DOCUMENTS

| | | | |
|---|---|---|---|
| 5,254,951 A | 10/1993 | Goto et al. | |
| 6,211,653 B1 | 4/2001 | Stasko | |
| 6,968,231 B1* | 11/2005 | Silvian et al. | 607/12 |
| 8,174,240 B2* | 5/2012 | Yun et al. | 320/132 |
| 2002/0140290 A1* | 10/2002 | Goto et al. | 307/10.1 |
| 2002/0180418 A1* | 12/2002 | Jones et al. | 324/118 |

(Continued)

FOREIGN PATENT DOCUMENTS

JP       62-254080       11/1987

OTHER PUBLICATIONS

U.S. Appl. No. 14/006,633, filed Sep. 20, 2013, Alexander C. Knill et al.

(Continued)

*Primary Examiner* — Arun Williams
(74) *Attorney, Agent, or Firm* — Oblon, McClelland, Maier & Neustadt, L.L.P.

(57) ABSTRACT

A current sense circuit for measuring a charge level of a battery is disclosure. The circuit comprising:

a shunt resistor (R10) connected between a high side terminal of the battery and a load/charge terminal for connecting the battery to a load;

translation circuitry arranged to produce a voltage across a pair of current sense terminals (GG_SRP, GG_SRN) in proportion to the voltage across the shunt resistor;

wherein one of the current sense terminals (GG_SRP) is provided on a first current path connected at one end between the high side terminal of the battery and the shunt resistor (R10), and connected at the other end to ground, and the other of the current sense terminals (GG_SRN) is provided on a second current path connected at one end between the shunt resistor (R10) and the load/charge terminal, and connected at the other end to ground.

9 Claims, 5 Drawing Sheets

(56) References Cited

U.S. PATENT DOCUMENTS

| | | | |
|---|---|---|---|
| 2003/0001544 A1* | 1/2003 | Nakanishi | 320/162 |
| 2007/0267997 A1* | 11/2007 | Kanazawa et al. | 320/108 |
| 2010/0134068 A1* | 6/2010 | Lim | 320/116 |
| 2012/0250359 A1 | 10/2012 | Knill | |
| 2012/0250372 A1 | 10/2012 | Knill et al. | |
| 2012/0250373 A1 | 10/2012 | Adam | |
| 2012/0250374 A1 | 10/2012 | Knill | |

OTHER PUBLICATIONS

United Kingdom Search Report issued Apr. 8, 2013 in GB 1222326.9, filed on Dec. 12, 2012 ( with written opinion).

"Zero Drift, Bidirectional Current Shunt Monitor", Analog Devices, AD8218, www.analog.com,, 2011-2013, 16 pages.

"High Voltage Current Shunt Monitor", Analog Devices, AD8212, www.analog.com,, 2007-2009, 16 pages.

* cited by examiner

CURRENT SENSE CIRCUIT FOR MEASURING A CHARGE LEVEL OF A BATTERY

CROSS REFERENCE TO RELATED APPLICATIONS

The present application claims priority to United Kingdom Application 1222326.9 filed on 12 Dec. 2012, the contents of which being incorporated herein by reference in its entirety.

BACKGROUND

1. Field of the Disclosure

The present disclosure relates to a current sense apparatus.

2. Description of Related Art

It is desirable to be able to determine a current capacity level of a battery or an array of batteries or cells. Gas gauge (also known as fuel gauge) circuitry can be used to predict an amount of energy stored in a battery pack, or in other words its current capacity. The prediction can be conducted by measuring Coulombs of charge going into and out of the battery. This is known as Coulomb counting. This can be achieved by measuring a voltage drop across a current sense (or shunt) resistor, which can be provided either at a high side (positive) or low side (0V or ground) terminal of the battery. For low voltage batteries (for example 3V to 12V) it is not crucially important whether the current sense resistor is provided at the positive or low-side (which may be) ground (0V) terminal. However, for higher voltage batteries (for example 24V to 60V) it is more desirable to use current sensing at the 0V terminal due to the low operating voltage of most semi-conductor processes used in commercial off-the-shelf gas gauge integrated circuits. An example gas gauge for this type of battery is the TI (Texas Instruments) bq27541-v200, which has a maximum supply voltage of 24V and employs low side current sensing. The TI bq27541 provides accurate capacity estimation and is known to work with a typical battery current waveform.

Unfortunately, it is difficult to provide a current sense resistor at the 0V terminal, mainly because access to the 0V terminal may be restricted by a need to connect the battery to a common ground (for example a car chassis), or by the need to provide protection circuitry at the 0V terminal. Further, there may be separate 0V terminals used for charging and discharging of the battery. For these reasons it may not be practical to directly measure current at the 0V terminal. Additionally, there may be multiple loads connected to the positive terminal of the battery, and it may be desirable to measure the current drained by each and/or all of these.

If a battery is provided with a high side current sense resistor, a direct interface with a gas gauge which uses low side current sensing (such as the bq27541) is problematic.

According to a first aspect of the present disclosure there is provided a current sense circuit for measuring a charge level of a battery, the circuit comprising: a shunt resistor (R10) connected between a high side terminal of the battery and a load/charge terminal for connecting the battery to a load; translation circuitry arranged to produce a voltage across a pair of current sense terminals (GG_SRP, GG_SRN) in proportion to the voltage across the shunt resistor; wherein one of the current sense terminals (GG_SRP) is provided on a first current path connected at one end between the high side terminal of the battery and the shunt resistor (R10), and connected at the other end to ground, and the other of the current sense terminals (GG_SRN) is provided on a second current path connected at one end between the shunt resistor (R10) and the load/charge terminal, and connected at the other end to ground.

The first current path may comprise a first resistor (R21) via which said one of the current sense terminals (GG_SRP) is connected to ground and a second resistor (R4) and a first transistor (Q4) provided in series via which said one of the current sense terminals (GG_SRP) is connected to the high side terminal of the battery; said second current path comprises a third resistor (R20) via which said other of the current sense terminals (GG_SRN) is connected to ground and a fourth resistor (R5) and a second transistor (Q8) provided in series via which said other of the current sense terminals (GG_SRN) is connected to the load/charge terminal; the first resistor (R21) has the same resistance as the second resistor (R4), and the third resistor (R20) has the same resistance as the fourth resistor (R5); said first transistor (Q4) and said second transistor (Q8) together control the voltage drop across the second resistor (R4) and the combined voltage drop across the fourth resistor (R5) and the shunt resistor (R10) to be substantially the same.

The first transistor (Q4) and the second transistor (Q8) may be controlled by feedback circuitry, the feedback circuitry comprising: drive circuitry operable to drive the gates of the first transistor (R4) and the second transistor (Q8) to increase or decrease the voltage drop across the second resistor (R4) and to increase or decrease the combined voltage drop across the fourth resistor (R5) and the shunt resistor (R10); and an operational amplifier configured to compare the voltage drop across the second resistor (R4) with the combined voltage drop across the fourth resistor (R5) and the shunt resistor (R10), and to control the drive circuitry to drive the gates of the first transistor (Q4) and the second transistor (Q8); wherein if the voltage drop across the second resistor (R4) is greater than the combined voltage drop across the fourth resistor (R5) and the shunt resistor (R10), the feedback circuitry increases the gate voltage to the first transistor (Q4) to reduce the voltage drop across the second resistor (R4) and decreases the gate voltage to the second transistor (R8) to increase the combined voltage drop across the fourth resistor (R5) and the shunt resistor (R10), and if the voltage drop across the second resistor (R4) is less than the combined voltage drop across the fourth resistor (R5) and the shunt resistor (R10), the feedback circuitry decreases the gate voltage to the first transistor (Q4) to increase the voltage drop across the second resistor (R4) and increases the gate voltage to the second transistor (Q8) to decrease the combined voltage drop across the fourth resistor (R5) and the shunt resistor (R10).

The drive circuitry may comprise: an additional supply rail at a fixed voltage below the high side terminal of the battery; a first drive path connected at one end between the high side terminal of the battery and the shunt resistor (R10), and connected at the other end to the additional supply rail, the first drive path being operable to drive the gate of the first transistor; and a second drive path connected at one end between the shunt resistor (R10) and the load/charge terminal, and connected at the other end to the additional supply rail, the second drive path being operable to drive the gate of the second transistor.

The first drive path may comprise a fifth resistor (R8), a third transistor of a current mirror (Q7) connecting together the first drive path and the second drive path, and a sixth resistor (R17), and the second drive path comprises a seventh resistor (R11), a fourth transistor of the current mirror (Q7), a fifth transistor (Q1-A), a sixth transistor (Q1-B) and an eighth resistor.

The current sense circuit may comprise filter circuitry for low pass filtering the output of the operational amplifier.

The current sense circuit may comprise a reference path connected at one end between the shunt resistor (R10) and the load/charge terminal and connected at the other end to the additional supply rail, the reference path comprising a ninth resistor (R9) and a tenth resistor (R12), the ninth resistor (R9) and tenth resistor (R12) forming a potential divider outputting a reference voltage to the gates of each of the fifth transistor (Q1-A) and the sixth transistor (Q1-B).

A smoothed output of the operational amplifier may be asserted at the emitters of each of the fifth and sixth transistors.

The voltage drop across the first transistor and the second transistor may be controlled to maintain a constant voltage drop across the second resistor, and a constant combined voltage drop across the fourth resistor and the shunt resistor when the voltage at the high side terminal of the battery varies.

BRIEF DESCRIPTION OF DRAWINGS

Embodiments of the present disclosure will now be described, by way of example only, and with reference to the accompanying drawings in which.

DETAILED DESCRIPTION OF THE EMBODIMENTS

In embodiments, it has been determined that level shifting a voltage developed across a high side shunt is a non-trivial task. To minimise dissipation, the voltage developed across the shunt is typically millivolts full scale. To translate this through 36V (the nominal battery voltage) with any degree of accuracy requires a circuit with enormous common mode rejection. This is particularly a concern when there is a high ripple voltage on the battery which can be caused by varying charge and load currents.

Figure 1:
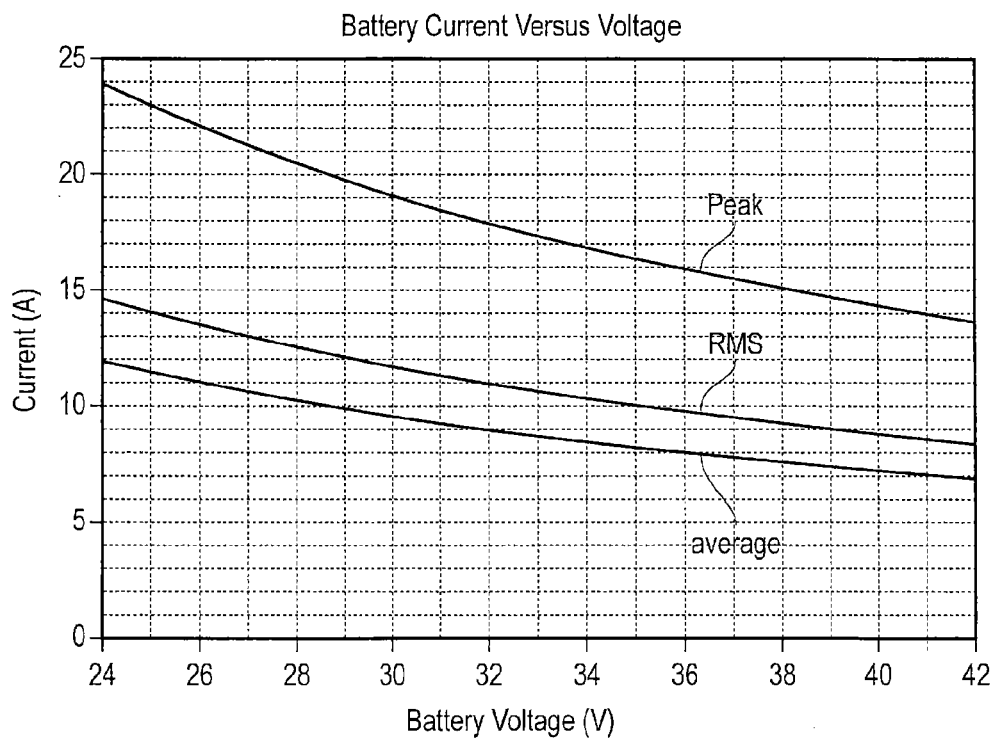
FIG. 1 shows the voltage versus current characteristics of an example battery to which embodiments of the present disclosure can be applied.

With reference to FIG. 1, a graph showing the battery current versus voltage of an example Antec battery pack being charged at an average power of 250 W is schematically illustrated. The example Antec battery pack comprises 10 series connected Lithium Iron Phosphate cells (sometimes written as a Lithium Ion cell). Typically, Lithium Iron Phosphate cells have a nominal cell voltage of 3.6V reaching 4.1V at end of charge. Minimum voltage during discharge should be limited to >2.4V to avoid irreversible damage. As such, the example Antec pack is assumed to have a nominal voltage of 36V with an operating range of 24V to 41V. This battery may be used in a power source battery to mains grid inverter. The graph of FIG. 1 shows the peak, average and RMS (Root Mean Square) battery currents at 250 W output to the grid over the assumed operating range of the Antec battery pack. An efficiency of 87% has been assumed.

Based on a worst case RMS current of 15 A (at a battery voltage of 24V in FIG. 1) and a 2 W (Watt) maximum power dissipation budget, a 5 mΩ shunt resistor is used (1.1 W actual dissipation). The peak voltage across this is 120 mV at 24 A. Suitable shunts are readily available in for example a 2512 package with temperature coefficients of 100 ppm/° C. or better (for example Welwyn ULR25 series, 1%, 50 ppm/° C.). For an example application, a minimum specified power might be 50 W, which equates to a battery current of approximately 1.4 A average at 36V. As a design target, the calibrated accuracy of the current sense circuitry should be better than 1% at this current.

At 1.4 A, the voltage developed across a 5 mΩ shunt is 7 μV. The battery voltage can vary from 24V discharged to 41V fully charged. To translate the shunt voltage drop through the varying battery voltage with a maximum error of say 0.5% would require a common mode rejection ratio of 114 dB. Similarly, any uncalibrated offset would need to be less than 35 μV.

The standard solution for high side current sensing uses a precision differential amplifier. To obtain the common mode input voltage range a precision resistor divider is employed. For optimum performance the resistor network is often integrated on-chip with a high performance op-amp. An example of this approach is the Analog Devices AD8218, a typical application circuit of which is shown in FIG. 2.

Figure 2:
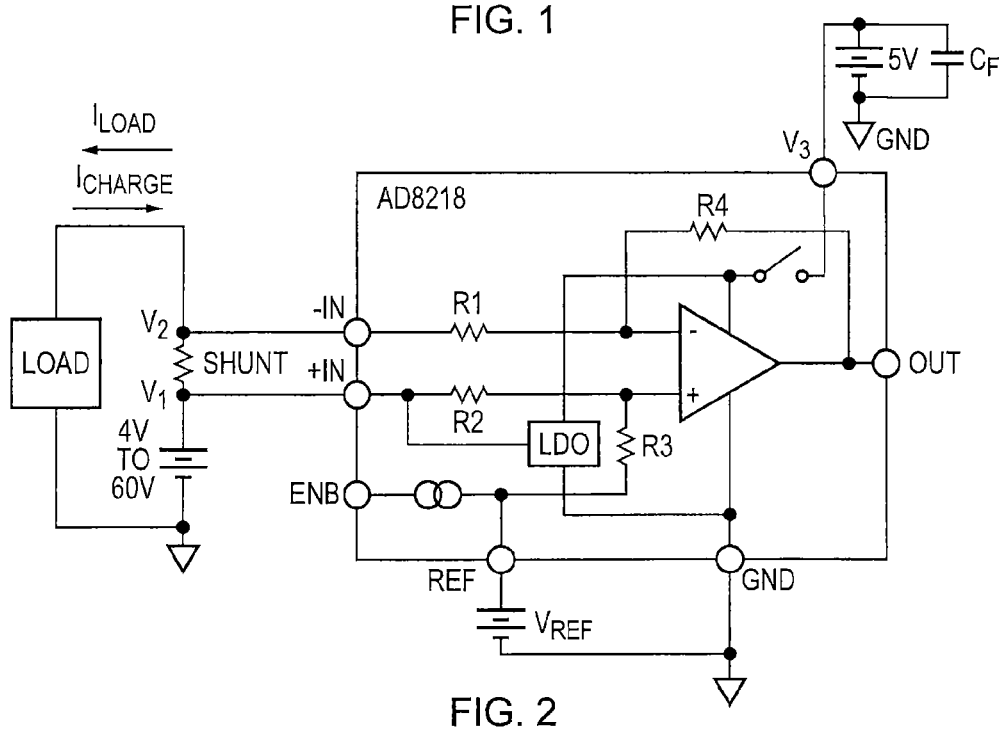
FIG. 2 schematically illustrates a circuit diagram for a typical application circuit for an Analog Devices AD8218 high side shunt amplifier circuit.

The primary factor limiting the performance of this approach is the matching between the four resistors R1, R2, R3 and R4 shown in FIG. 2. Any mismatch in value between these resistors translates directly into common mode gain. The resistors inside the AD8218 are matched to within 0.01%, but even with this degree of matching the typical common mode rejection ratio is quoted as 110 dB with a minimum of 90 dB, well below what is required to meet the accuracy target indicated above. This circuit is also designed for unidirectional operation where current flows only in one direction.

Figure 3:
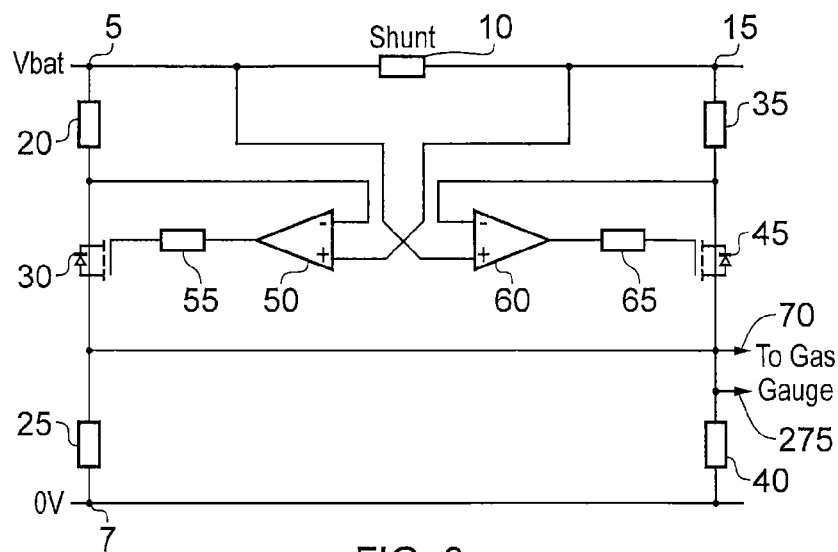
FIG. 3 schematically illustrates a current sense circuit according to a first embodiment of the present disclosure.

Referring to FIG. 3, a better approach is shown. In FIG. 3, a current source is used to translate the small voltage developed across the shunt into a current which can then be easily shifted through the required common mode voltage.

In FIG. 3, a shunt resistor 10 is connected to the positive (Vbat) terminal 5 of a battery. The voltage across the shunt resistor 10 provides a measure of the current flowing through the shunt resistor 10, and the measurement of this current flow over time can be used to predict a current charge level of the battery.

Consider the discharge case where the current taken at point 15 is supplied by the battery connected to terminal 5. As the current flows through shunt resistor 10, terminal 15 will be lower than terminal 5. If it is assumed that a start-up case where the current through resistor 35 is 0V, the non-inverting input of operational amplifier 60 will be at a voltage lower than its inverting input. Therefore, the voltage at operational amplifier 60 will be Vbat. This voltage is applied to a field effect transistor (FET) 45 via resistor 65 which causes the FET 45 to turn off. So, no current will flow through resistor 35 or 40 and the output to the gas gauge 75 will be 0V. This situation will remain as long as the battery is being discharged.

A current path comprising resistors 20, 25 and a Field Effect Transistor (FET) 30 is connected between the positive terminal 5 and the 0V terminal of the battery. The resistance of each of the resistors 20, 25 is fixed, usually at the same value. The resistance of the FET 30 varies in dependence on the voltage asserted at its gate, making the FET 30 a variable resistor. The voltage asserted at the gate of FET 30 is provided by an operational amplifier 50 which outputs to the gate of the FET 30 via a resistor 55. The operational amplifier 50 is supplied by the voltage rails Vbat and 0V (supply connections for the operational amplifier are not shown), and outputs a voltage of either Vbat or 0V, depending on the voltages applied to its inputs. In particular, the operational amplifier 50 has its non-inverting input connected between the shunt resistor 10 and an output terminal 15 which is for connection to a load or charge device. The inverting input of the operational amplifier is connected between the resistor 20 and the FET 30 of the first current path. The operational amplifier 50 acts as a high gain amplifier, outputting a voltage which increases towards Vbat when the voltage at its non-inverting input is higher than the voltage at its inverting input, and outputting a voltage which decreases towards 0V when the voltage at its inverting input is higher than the voltage at its non-inverting input. The comparison being made by the operational amplifier 50 is a comparison of the voltage drop across the resistor 20 with the voltage drop across the shunt resistor 10. By controlling the resistance of the FET 30 based on a comparison of the voltage drop across the resistor 20 with the voltage drop across the shunt resistor 10, the voltage drop across the resistor 20 can be continuously controlled to reflect the voltage drop across the shunt resistor 10. As a result of the fact that the resistors 20 and 25 are of a fixed resistance, the voltage drop across the resistor 25 will have a fixed relationship to the voltage drop across the resistor 20. For example, if both of the resistors 20, 25 have the same resistance value, they will both exhibit the same voltage drop. As can be seen from FIG. 3, one of the output lines 70 to the gas gauge is connected between the FET 30 and the resistor 25. The voltage at this output line will therefore be the same as the voltage drop across the resistor 20, which as explained above is maintained with the same voltage drop as across the shunt resistor 10.

The charging case where current supplied at terminal 15 is transferred to the battery connected at terminal 5 will now be described. As the current flows through shunt resistor 10, terminal 15 will be at a higher voltage than terminal 5. If we assume a start-up case where the current through resistor 20 is 0V, the non-inverting input of operational amplifier 60 will be at a voltage lower than its inverting input. Therefore, the output of the operational amplifier 60 will be Vbat. This voltage is applied to FET 30 via resistor 55 which causes the FET 30 to turn off. So, no current flows through resistor 20 or 25 and the output line 70 to the gas gauge is 0V. This situation will remain as long as the battery is being discharged.

A current path comprising resistors 35, 40 and a Field Effect Transistor (FET) 45 is connected at one end between the shunt resistor 10 and the load/charge terminal 15, and at the other end to 0V terminal of the battery. The resistance of each of the resistors 35, 40 is fixed, usually at the same value. The resistance of the FET 45 varies in dependence on the voltage asserted at its gate, making the FET 45 a variable resistor. The voltage asserted at the gate of FET 45 is provided by an operational amplifier 60 which outputs to the gate of the FET 45 via a resistor 65. The operational amplifier 60 is supplied by the voltage rails Vbat and 0V (supply connections for the operational amplifier are not shown), and outputs a voltage tending towards either Vbat or 0V, depending on the voltages applied to its inputs. In particular, the operational amplifier 60 has its non-inverting input connected to the positive terminal 5 of the battery. The inverting input of the operational amplifier is connected between the resistor 35 and the FET 45 of the second current path. The operational amplifier 60 acts as a comparator, outputting a voltage tending towards Vbat when the voltage at its non-inverting input is higher than the voltage at its inverting input, and outputting a voltage tending towards 0V when the voltage at its inverting input is higher than the voltage at its non-inverting input. The comparison being made by the operational amplifier 60 is a comparison of the combined voltage drop across the resistor 20 and the shunt resistor 10 with the voltage at the output terminal 5 of the battery. By controlling the resistance of the FET 45 based on this comparison, the combined voltage drop across the resistor 20 and the shunt resistor 10 can be driven towards zero. As a result of the fact that the resistors 35 and 40 are of a fixed resistance, the voltage drop across the resistor 40 will have a fixed relationship to the voltage drop across the resistor 35. For example, if both of the resistors 35, 40 have the same resistance value, they will both exhibit the same voltage drop. As can be seen from FIG. 3, one of the output lines 75 to the gas gauge is connected between the FET 45 and the resistor 40. The voltage at this output line will therefore be the same as the voltage drop across the resistor 35, which as explained above is maintained close to 0V.

Accordingly, during discharge, the voltage exhibited at one of the gas gauge terminals 70 and 75 will be close to zero, while the voltage exhibited at the other of the gas gauge terminals 75 will correspond to (or be related to if the resistors 20 and 25 have different values) the voltage drop from Vbat measured at the load/charge terminal 15 side of the shunt resistor 10.

During charge, the voltage exhibited at one of the gas gauge terminals 70 will be close to zero, while the voltage exhibited at the other of the gas gauge terminals 75 will correspond to (or be related to if the resistors 40 and 35 have different values) the voltage drop from Vbat measured at the load/charge terminal 15 side of the shunt resistor 10. The voltage difference between the two gas gauge output terminals 70 and 75 will therefore be the same as (or related to) the voltage drop across the shunt resistor 10 during both charge and discharge.

Since the circuit of FIG. 3 does not rely on resistor matching for its common mode rejection, it is capable of achieving the required performance. Unlike the solution shown in FIG. 2, the op-amps must be powered from the positive battery terminal (Vbat). This requires the use of op-amps with inputs that are capable of operating outside of their supply rails by at least 120 mV (maximum shunt voltage during charge). Suitable devices are available from manufacturers such as TI (OPA333) and Linear Technology (LT1672).

A drawback to the approach of FIG. 3 is that one op-amp is used to track the voltage drop across shunt resistor 10 for positive (charge) current and the other for negative (discharge) current. This means that the offset is different from each current direction which may lead to cross-over distortion and making offset calibration via the bq27541 difficult or impossible. Finding op-amps with <17.5 µV offset (±17.5 µV=35 µV) and the required input voltage range is difficult. For this reason, the circuit of FIG. 4 has been developed.

Figure 4:
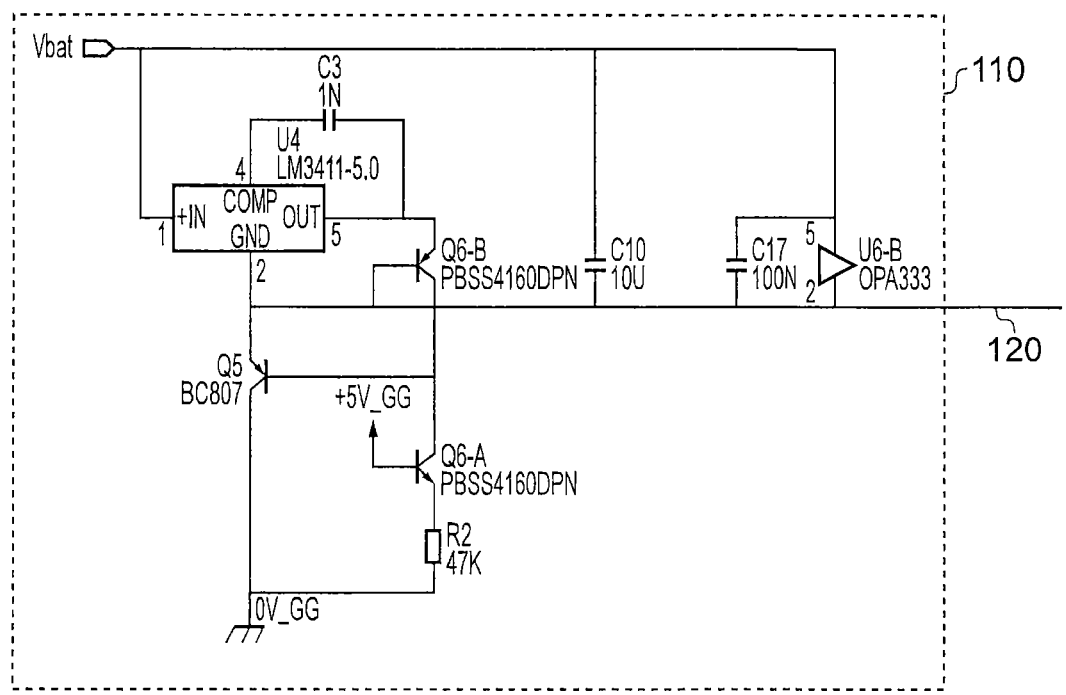
FIG. 4 schematically illustrates a current sense circuit according to a second embodiment of the present disclosure.
Figure 4:
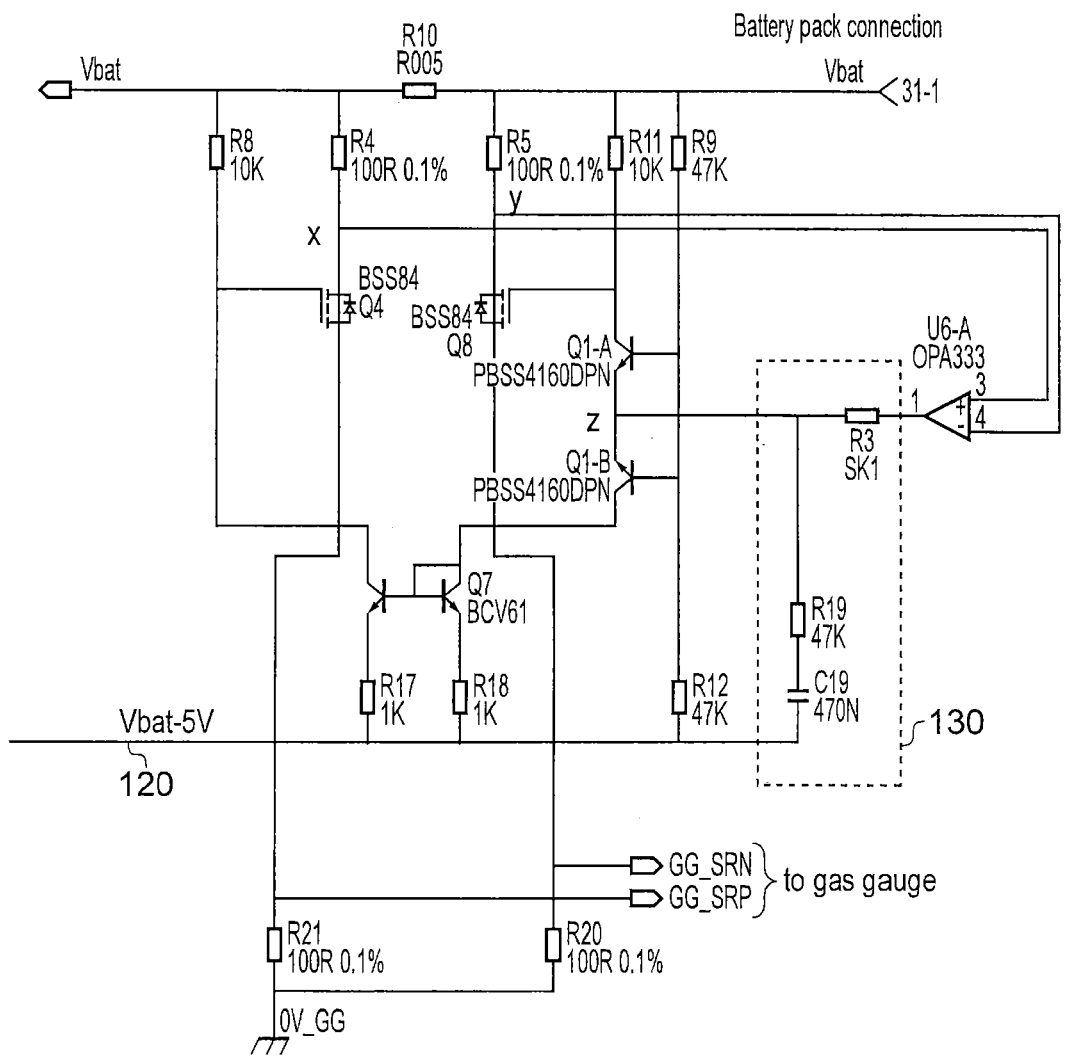

In the circuit of FIG. 4, a single op-amp is used for both current directions. The offset is constant and can therefore be easily calibrated out by the bq27541.

In FIG. 4, an additional supply rail 120 at Vbat−5V is provided. This is generated by a voltage regulator 110. The voltage regulator 110 of this example operates up to 41V and has a suitably low quiescent current. For reference the quiescent current for the bq27541 gas gauge is 60 µA plus 15 µA for a voltage regulator used to supply it. The voltage regulator 110 utilises a National Semiconductor LM3411 U4 shunt voltage regulator and some external transistors Q5, Q6-A, Q6-B to generate the required voltage rail. The total quiescent current is 18 μA comprising of 100 μA bias current for the PNP pass element plus 85 μA for the LM3411.

The LM3411 U4 is designed to regulate so that GND is 5 volts lower than +IN (which receives the pack voltage Vbat). A voltage of +5V on the base of Q6-A causes the transistor to turn on. The current through resistor R2 (47 kΩ) is approximately 100 uA, which is used to bias the base of transistor Q5 so it is VBE (voltage drop base to emitter) lower than the GND terminal of regulator 110. If GND terminal of regulator 110 is lower than the pack voltage −5V (i.e. Vbat −5V) then the OUT terminal of regulator 110 will go higher in voltage. This then causes the transistor Q6-B to turn on. This in turn causes the transistor Q5 to turn off and for the GND terminal of the regulator 110 to rise in voltage.

Similarly, if the GND terminal of regulator 110 is higher than the pack voltage−5V (i.e. Vbat−5V) then the OUT terminal of the regulator 110 will go lower in voltage. This causes the transistor Q6-B to turn off, which in turn causes the transistor Q5 to turn on and the GND terminal of regulator 110 to fall in voltage. The capacitor C10 (10 μF) acts as a filtering capacitor to stabilise this feedback system. Thus the GND terminal of the regulator U4 will tend become regulated at the pack voltage−5V.

Similarly to the circuit of FIG. 3, the current sense circuit of FIG. 4 comprises a shunt resistor R10 (5Ω) which is connected to the positive (Vbat) terminal of a battery. The voltage across the shunt resistor R10 provides a measure of the current flowing through the shunt resistor R10, and the measurement of this current flow over time can be used to predict a current charge level of the battery. A first current path comprising resistors R4, R21 and a Field Effect Transistor (FET) Q4 is connected between the positive terminal and the 0V terminal of the battery. The resistance of each of the resistors R4, R21 is fixed, in the present case both being fixed at 100Ω. These resistors have a tolerance of 0.1%. The resistance of the FET Q4 varies in dependence on the voltage asserted at its gate, making the FET Q4 a variable resistor. The voltage asserted at the gate of FET Q4 is provided by feedback and driving circuitry, which will be described in detail below. As a result of the fact that the resistors R4 and R21 are of a fixed resistance, the voltage drop across the resistor R21 will have a fixed relationship to the voltage drop across the resistor R4. In the present case they will exhibit the same voltage drop. As can be seen from FIG. 4, one of the output lines GG_SRP to the gas gauge is connected between the FET Q4 and the resistor R21. The voltage at the output line GG_SRP will therefore be the same as the voltage drop across the resistor R4.

A second current path comprising resistors R5, R20 and a Field Effect Transistor (FET) Q8 is connected at one end between the shunt resistor R10 and a load/charge terminal (battery pack connection), and at the other end to a 0V terminal of the battery. The resistance of each of the resistors R5, R20 is fixed, in this case at the same value 100Ω. These resistors have a tolerance of 0.1%. The resistance of the FET Q8 varies in dependence on the voltage asserted at its gate, making the FET Q8 a variable resistor. The voltage asserted at the gate of FET Q8 provided by feedback and driving circuitry, which will be described in detail below. As a result of the fact that the resistors R5 and R20 are of a fixed resistance, the voltage drop across the resistor R20 will have a fixed relationship to the voltage drop across the resistor R5. In the present case they will exhibit the same voltage drop. As can be seen from FIG. 4, one of the output lines GG_SRN to the gas gauge is connected between the FET Q8 and the resistor R20. The voltage at the output line GG_SRN will therefore be the same as the voltage drop across the resistor R5.

The feedback and driving circuitry explained below is intended to maintain the voltage at points x and y in FIG. 4 at the same value. As a result, the voltage drop across the resistor R4 and the combined voltage drop across the resistor R5 and the shunt resistor R10 are controlled to be the same. Since the voltage output at the terminal GG_SRP mirrors the voltage drop across the resistor R4 and the voltage output at the terminal GG_SRN mirrors the voltage drop across the resistor R5, the difference between the voltage at GG_SRP and GG_SRN will be the same as the voltage drop across the shunt resistor R10. In FIG. 4, the ratio of the voltage drop across the shunt to the voltage difference between the terminals GG_SRP and GG_SRN should be 1:1, because the resistors R4, R5, R20 and R21 all have the same value of resistance of 100Ω. A different ratio can be achieved by changing the resistance ratio of R4:R21 and R5:R20. For example, a 2×amplification of the voltage magnitude could be achieved by setting the resistance of the resistors R20 and R21 to double that of the resistors R4 and R5.

An operational amplifier U6-A (in this case an OPA333 operational amplifier) is set up as a comparator, and is supplied by the Vbat rail and the Vbat−5V rail. The operational amplifier U6-A compares the voltage at the points x and y in FIG. 4. In particular, the voltage at the point x is provided to the non-inverting input of the operational amplifier U6-A and the voltage at the point y is provided to the inverting input of the operational amplifier U6-A.

The operation of the circuit of FIG. 4 will now be described.

In the case that the battery is charging with 2 A flowing through shunt resistor R10, there is a voltage drop of 10 mV across shunt resistor R10. In the case that FET Q8 and FET Q4 are off and the current flow through resistors R4 and R5 is zero, point x will be at Vbat and point y will be at Vbat+0.1V. Therefore, the output from the operational amplifier U6-A will tend to decrease.

The output of the operational amplifier U6-A is filtered (smoothed) by low-pass filter circuitry 130. In this case, the low pass filter circuitry 130 comprises a resistor R3 (5.1 kΩ), a resistor R19 (47 kΩ) and a capacitor C19 (470 nF). It will be appreciated that various other types and configurations of low pass filter are envisaged. Further, other dedicated comparator chips are available with integrated smoothing circuitry which may be used instead of the combination of operational amplifier U6-A and low pass filter circuitry 130. The purpose of the low pass filter circuitry 130 is to translate the Vbat/Vbat−5V output of the operational amplifier U6-A into a smoothed waveform which appears at point z in FIG. 4.

A reference path is provided between the Vbat rail and the Vbat−5V rail. The reference path comprises two resistors R9 and R12 which are matched at 47 kΩ. The arrangement of resistors R9 and R12 is as a potential divider which outputs a reference voltage of Vbat−2.5V which is used as a reference against which the smoothed output of the operational amplifier U6-A is compared.

The comparison is performed by transistors Q1-A and Q1-B. As, in the given start up conditions, the voltage at point z decreases, when the voltage at point z reaches Vbe Volts below the reference voltage Vbat−2.5V, transistor Q1-A will start to switch on. As transistor Q1-B is off, transistors Q4 and Q7 will be off. Therefore, no current flows through resistor R4 (100Ω). Accordingly, point x will be at voltage Vbat.

As transistor Q1-A starts to turn on, current will flow through resistor R11 (10 kΩ) and as the current increases, transistor Q8 will start to turn on. The turning on of Q8 means that current will flow through resistor R5 (100Ω). The voltage across resistor R5 increases until the voltage at points x and y is the same. The feedback path via operational amplifier U6-A ensures that this condition is maintained. The voltage across resistor R5 is the same as the voltage across shunt resistor R10.

The current through resistor R4 is the same as the current through resistor R21 (100Ω). As the value of resistor R4 is the same as the value of resistor R21, the voltage drop across each resistor is the same. In this case, there is no voltage drop. The current through resistor R5 (100Ω) is the same as that through resistor R20 (100Ω). Thus, as the values of resistors R5 and R20 are the same, the voltage drop across resistor R5 will equal the voltage drop across resistor R20. As the voltage drop across resistor R5 is the same as the voltage drop across shunt resistor R10, the voltage at a first current sense terminal GG_SRP will be 0V and the voltage at a second current sense terminal GG_SRN will be +10 mV. Therefore the voltage between the first and second current sense terminals is the same as the voltage drop across shunt resistor R10.

In the case that the battery is discharged, the circuit operates in a similar manner but transistor Q1-A and Q8 will be off. Accordingly, the voltage drop across R5 and R20 will be zero Volts. Q1-B will be partially on along with the current mirror arrangement of Q7. Also, transistor Q4 will be partially on. The feedback loop via the operational amplifier will ensure that the voltage drop across resistor R21 is the same as the voltage drop across R10 for the same reasons explained above with reference to the charging of the battery.

In the case that the discharge of the battery is 2 A, the first current sense terminal GG_SRN will be at zero Volts and the second current sense terminal GG_SRP will be at 10 mV. Therefore, the voltage between the first and second current sense terminals is the same as the voltage drop across the shunt resistor R10.

It is important that the voltage difference between GG_SRN and GG_SRP be dependent only on the voltage drop across R10. It is not desirable for the voltage difference between GG_SRN and GG_SRP be dependent also on the battery voltage Vbat, because this may change over time as the battery capacity is depleted. The transistors Q4 and Q8, acting as variable resistors, are able to control the voltage drop across the resistor R4, and the combined voltage drop across the resistor R5 and the shunt resistor R10 to be a fixed value. In effect, the transistors Q4 and Q8 compensate for voltage deviations due to changes in Vbat.

Figure 5:
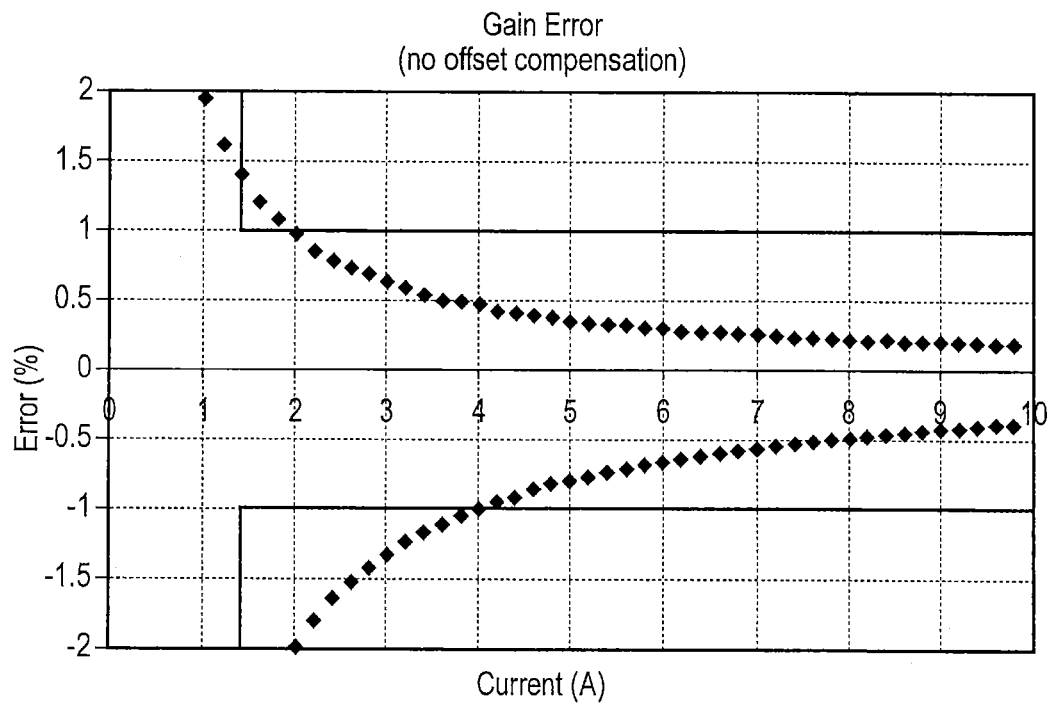
FIG. 5 schematically illustrates the gain error for the circuit shown in FIG. 4 if it were to use a low performance operational amplifier.

Referring to FIG. 5, a graph showing the gain error for the circuit of FIG. 4, but using an LT1673 operational amplifier in place of the OPA333 operational amplifier is schematically illustrated. The measurements for the graph of FIG. 5 were taken using a 6½ digit DVM (digital voltmeter). Residual offset and gain error have been removed by linear regression (gain error and offset correction).

Figure 6:
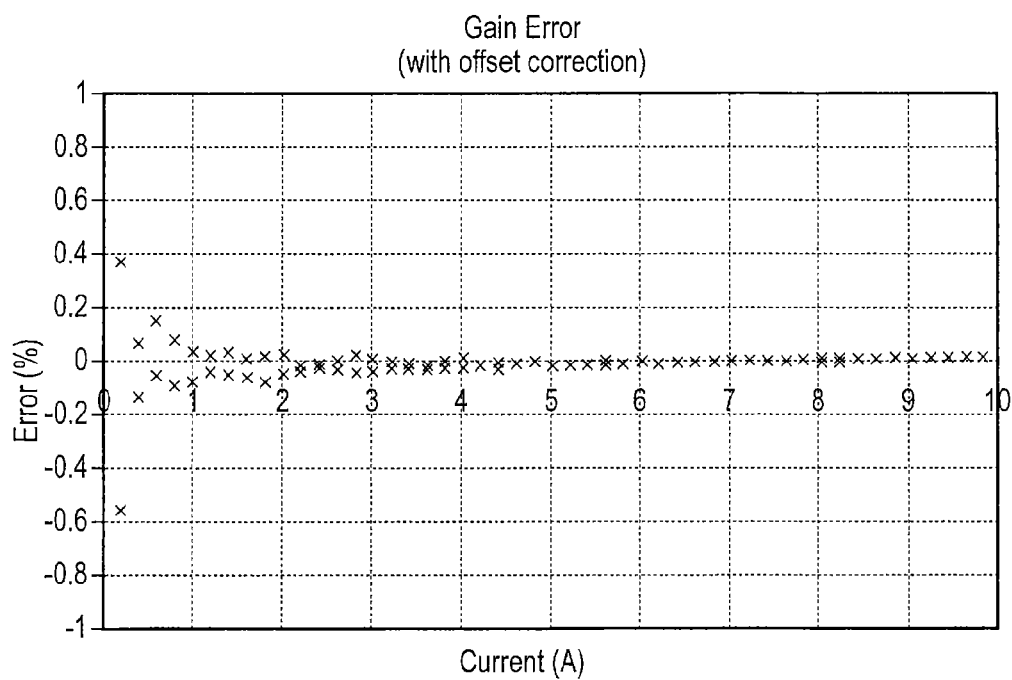
FIG. 6 schematically illustrates the gain error data of FIG. 5, but with offset correction.

Referring to FIG. 6, a graph showing the same data as FIG. 5, but with offset correction is shown. Residual offset and gain error has been removed by linear regression (gain error and offset correction). This shows that good performance can be achieved, but this requires correction.

The bq27541 gas gauge periodically calibrates the offset of its internal coulomb counter. It performs this by shorting the inputs to the coulomb counter that prevents it from being able to compensate for any external offset. Based on the LT1673 offset specification of 200 μV typical and 475 μV maximum and 5 mΩ shunt, the current offset should be 40 mA typically and 95 mA at worst. At 1.4 A, this is 3% and 7% respectively and is therefore, outside the target specification of 1%.

Figure 7:
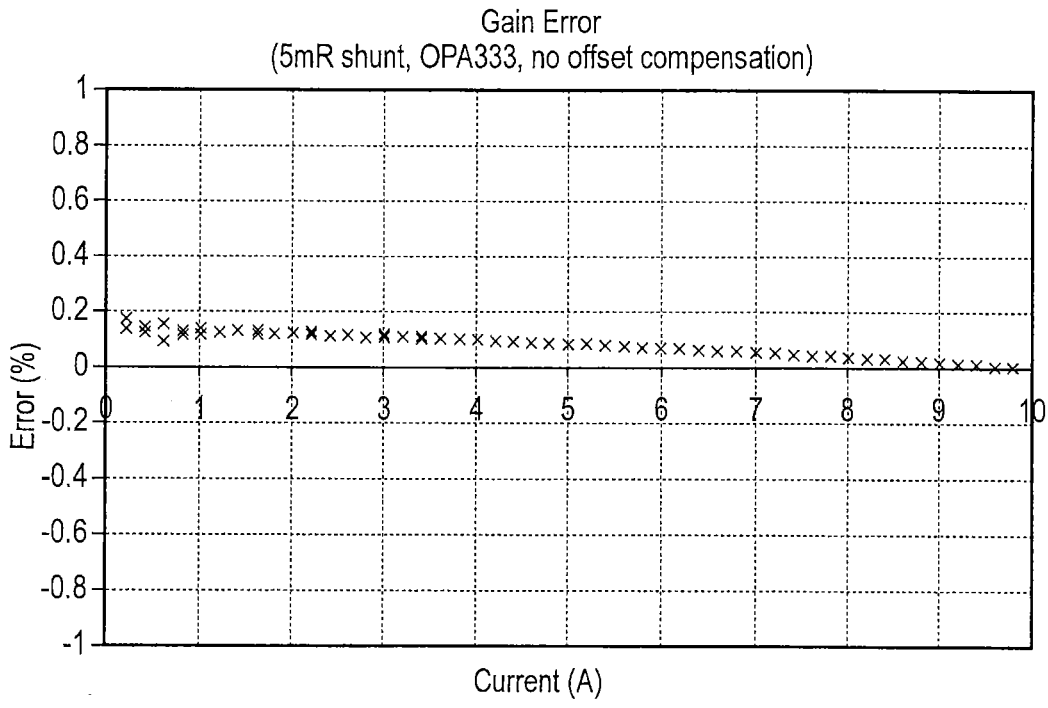
FIG. 7 schematically illustrates the gain error using an OPA333 op-amp, with no offset correction.

Referring to FIG. 7, a graph showing the gain error using an OPA333 op-amp is schematically illustrated. In this case no offset correction has been performed. It can be seen that with this op-amp, the circuit meets the required specification.

The circuit of FIG. 4 using an OPA333 operational amplifier has no measurable mechanism for the generation of common mode errors. It was not possible to observe any common mode error with a 6½ digit DVM over the range of 24V to 41V. This implies a CMMR of greater than 144 dB.

The OPA333 employs an auto-zero technique and as such has a maximum offset voltage of 10 μV. This equates to 2 mA current measurement error due to the high side to low side level shift which is 0.14%, below the target specification of 1% at 1.4 A. The bq27541 gas gauge calibration can be used to reduce the overall impact of its internal offsets and the accuracy of the 5 mΩ shunt resistor allowing the overall 1% target to be met.

The invention claimed is:

1. A current sense circuit for measuring a charge level of a battery, the circuit comprising:
    a shunt resistor connected between a high side terminal of the battery and a load/charge terminal for connecting the battery to a load; and
    translation circuitry arranged to produce a voltage across a pair of current sense terminals in proportion to the voltage across the shunt resistor, wherein
    one of the current sense terminals is provided on a first current path connected at one end between the high side terminal of the battery and the shunt resistor, and connected at the other end to ground,
    the other of the current sense terminals is provided on a second current path connected at one end between the shunt resistor and the load/charge terminal, and connected at the other end to ground,
    said first current path comprises a first resistor via which said one of the current sense terminals is connected to ground and a second resistor and a first transistor provided in series via which said one of the current sense terminals is connected to the high side terminal of the battery, and
    said second current path comprises a third resistor via which said other of the current sense terminals is connected to ground and a fourth resistor and a second transistor provided in series via which said other of the current sense terminals is connected to the load/charge terminal.

2. A current sense circuit according to claim 1, wherein the first resistor has the same resistance as the second resistor, and the third resistor has the same resistance as the fourth resistor, and
    said first transistor and said second transistor together control the voltage drop across the second resistor and the combined voltage drop across the fourth resistor and the shunt resistor to be substantially the same.

3. A current sense circuit according to claim 2, wherein the first transistor and the second transistor are controlled by feedback circuitry, the feedback circuitry comprising:
    drive circuitry operable to drive the gates of the first transistor and the second transistor to increase or decrease the voltage drop across the second resistor and to increase or decrease the combined voltage drop across the fourth resistor and the shunt resistor; and
    an operational amplifier configured to compare the voltage drop across the second resistor with the combined voltage drop across the fourth resistor and the shunt resistor, and to control the drive circuitry to drive the gates of the first transistor and the second transistor;

wherein
if the voltage drop across the second resistor is greater than the combined voltage drop across the fourth resistor and the shunt resistor, the feedback circuitry increases the gate voltage to the first transistor to reduce the voltage drop across the second resistor and decreases the gate voltage to the second transistor to increase the combined voltage drop across the fourth resistor and the shunt resistor, and if the voltage drop across the second resistor is less than the combined voltage drop across the fourth resistor and the shunt resistor, the feedback circuitry decreases the gate voltage to the first transistor to increase the voltage drop across the second resistor and increases the gate voltage to the second transistor to decrease the combined voltage drop across the fourth resistor and the shunt resistor.

4. A current sense circuit according to claim 3, wherein the drive circuitry comprises:
an additional supply rail at a fixed voltage below the high side terminal of the battery;
a first drive path connected at one end between the high side terminal of the battery and the shunt resistor, and connected at the other end to the additional supply rail, the first drive path being operable to drive the gate of the first transistor; and
a second drive path connected at one end between the shunt resistor and the load/charge terminal, and connected at the other end to the additional supply rail, the second drive path being operable to drive the gate of the second transistor.

5. A current sense circuit according to claim 4, wherein the first drive path comprises a fifth resistor, a third transistor of a current mirror convecting together the first drive path and the second drive path, and a sixth resistor, and the second drive path comprises a seventh resistor, a fourth transistor of the current mirror, a fifth transistor, a sixth transistor and an eighth resistor.

6. A current sense circuit according to claim 3, comprising filter circuitry for low pass filtering the output of the operational amplifier.

7. A current sense circuit according to claim 5, comprising a reference path connected at one end between the shunt resistor and the load/charge terminal and connected at the other end to the additional supply rail, the reference path comprising a ninth resistor and a tenth resistor, the ninth resistor and tenth resistor forming a potential divider outputting a reference voltage to the gates of each of the fifth transistor and the sixth transistor.

8. A current sense circuit according to claim 7, wherein a smoothed output of the operational amplifier is asserted at the emitters of each of the fifth and sixth transistors.

9. A current sense circuit according to claim 2, wherein the voltage drop across the first transistor and the second transistor are controlled to maintain a constant voltage drop across the second resistor, and a constant combined voltage drop across the fourth resistor and the shunt resistor when the voltage at the high side terminal of the battery varies.

* * * * *